US006218866B1

(12) United States Patent
Poplevine et al.

(10) Patent No.: US 6,218,866 B1
(45) Date of Patent: Apr. 17, 2001

(54) SEMICONDUCTOR DEVICE FOR PREVENTION OF A FLOATING GATE CONDITION ON AN INPUT NODE OF A MOS LOGIC CIRCUIT AND A METHOD FOR ITS MANUFACTURE

(75) Inventors: Pavel Poplevine, Foster City; Alexander Kalnitsky, San Francisco, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/416,826

(22) Filed: Oct. 12, 1999

(51) Int. Cl.[7] .................................................. H01L 25/00
(52) U.S. Cl. ........................ 326/103; 326/101; 326/136
(58) Field of Search ................................. 326/101, 102, 326/103, 136

(56) References Cited

U.S. PATENT DOCUMENTS 5,164,617 * 11/1992 Hanibuchi et al. .................. 307/446
5,880,001 * 3/1999 Camenzind ......................... 438/330

OTHER PUBLICATIONS

S. Wolf, Silicon Processing for the VLSI Era, vol. 2—Process Integration, pp. 373–376 (Lattice Press, 1990).

* cited by examiner

Primary Examiner—Michael Tokar
Assistant Examiner—Anh Q. Tran
(74) Attorney, Agent, or Firm—Pillsbury Winthrop LLP

(57) ABSTRACT

A semiconductor device for preventing a floating gate condition on an input node of an MOS logic circuit. The semiconductor device includes a semiconductor substrate (typically p-type) with a deep well region (typically n-type) below its surface, a first surface well region (typically n-type) on the substrate that circumscribes the deep well region, and a narrow channel region (typically p-type) separating the deep well region from the first surface well region. The semiconductor device also includes a first contact region for connecting the first surface well region to the input node, a second contact region for connecting the substrate region above the deep well to the input node, and a third contact region for connecting the semiconductor substrate (outside of the first surface well region) to ground, thereby providing a low impedance resistive path between the input node and ground. When a high logic state is applied to the first and second contact regions via an output node of driving circuitry within the MOS logic circuit, however, the width of the narrow channel region is pinched-off, thereby isolating the input node (and the output node of the driving circuitry) from ground. A process for forming the semiconductor device is also provided that includes the use of photomasking and ion implantation processes.

15 Claims, 5 Drawing Sheets

SEMICONDUCTOR DEVICE FOR PREVENTION OF A FLOATING GATE CONDITION ON AN INPUT NODE OF A MOS LOGIC CIRCUIT AND A METHOD FOR ITS MANUFACTURE

BACKGROUND OF THE INVENTION

1. Field of the Invention

The present invention relates to semiconductor devices and, in particular, to devices for the prevention of a floating gate condition in MOS logic circuits and processes for their manufacture.

2. Description of the Related Art

Referring to FIG. 1, a conventional Metal-Oxide-Semiconductor (MOS) logic circuit in the form of an inverter 10 is illustrated. Inverter 10 includes interconnected MOS transistors 12 and 14, and is capable of producing an output state (e.g., an output voltage) at the output node 16 in response to an input state (e.g., an input voltage) applied at the input node 18. The input node 18 is connected to the gates of the MOS transistors 12 and 14. In other words, the gates of these MOS transistors 12 and 14 are connected to each other to serve as the input node 18. For a further explanation of MOS inverters, see S. Wolf, *Silicon Processing for the VLSI Era, Vol. 2—Process Integration*, 373–376 (Lattice Press, 1990), which is hereby fully incorporated by reference.

Input node 18 is referred to as a "floating gate" since there is no electrical connection between the input node 18 (which is made up of the connected gates of MOS transistors 12 and 14) and either ground (GND) or the power supply voltage ($V_{DD}$). In this regard, the term "floating gate" refers to the fact that the input state (i.e., input voltage) on the input node 18 and, therefore on the gates of the MOS transistors 12 and 14, is undefined and unknown. As a result, the output state produced by the inverter 10 at output node 16 is also undefined and unknown. Such an undesirable "floating gate" condition on the input node of an MOS logic circuit can be prevented by providing an electrical connection between the input node and either GND or $V_{DD}$. Conventional semiconductor devices for this purpose can take the form of: (i) a resistor 20 connected between input node 18 of the MOS logic circuit and GND, as shown in FIG. 2; and (ii) an MOS transistor 30 with its gate connected to $V_{DD}$, while its source is connected to input node 18 of the MOS logic circuit and its drain is connected to GND, as shown in FIG. 3.

The operation of conventional MOS logic circuits requires that a well defined logic state of either "0" or "1" be generated and applied to the input node of the MOS logic circuit by driving circuitry included within the MOS logic circuit. For example, a "0" or "1" logic state can be generated from the output node of another inverter or other MOS logic element. A logic state of "0" represents a voltage of essentially zero volts (e.g., GND or $V_{SS}$) and is commonly referred to as a "low" state. A logic state of "1" represents a voltage of a magnitude significantly greater than that of the logic state of "0". The logic state of "1" is typically equal to $V_{DD}$, and is generally referred to as a "high" state. If neither of these well defined logic states is applied to the input node of a MOS logic circuit, the input node of the MOS logic circuit can assume a random ambiguous state (i.e., an undefined state), thereby generating a random output state.

FIG. 4 illustrates an MOS logic circuit 40 wherein an inverter 42 is connected via its input node 44 to the output node 46 of driving circuitry 48 (which is illustrated for the purposes of this description as an MOS inverter). The input node 44 of inverter 42 and the output node 46 of driving circuitry 48 are also electrically connected to GND via resistor 50. A drawback of this configuration is that current is constantly consumed when the driving circuitry 48 is imposing a high logic state on the input node 44 of inverter 42. The path of this current consumption is shown by the dashed arrow in FIG. 4.

Still needed in the art is a semiconductor device that is capable of preventing a "floating gate" condition on an input node of a MOS logic circuit. The semiconductor device should also provide for reduced power consumption when the input mode of the MOS logic circuit is driven to a high state by driving circuitry. Also needed is a process for its manufacture that is simple and compatible with standard semiconductor device processing.

SUMMARY OF THE INVENTION

The present invention provides a semiconductor device that prevents a floating gate condition on the input node of an MOS logic circuit. Semiconductor devices according to the present invention provide a near "short circuit" (i.e., a low impedance resistive path) between the input node of an MOS logic circuit (for example, a CMOS NOT gate, NOR gate, NAND gate, or CMOS logic circuits associated with embedded memory circuits) and GND (e.g., $V_{SS}$) when an input signal to the input node of the MOS logic circuit is "low" (e.g., the input node is at low state) or undefined. Semiconductor devices according to the present invention also isolate the input node of the MOS logic circuit from GND when the input signal to the input node is driven "high" (e.g., the input node is at high state) by driving circuitry included within the MOS logic circuit. Therefore, semiconductor devices according to the present invention prevent a floating gate condition from occurring on the input node of an MOS logic circuit.

Semiconductor devices in accordance with the present invention include a semiconductor substrate of a first conductivity type (typically p-type) with an active area on its surface and a vertically integrated pinch resistor formed in the semiconductor substrate. The vertically integrated pinch resistor includes a deep well region of a second conductivity type (typically n-type) disposed below both the semiconductor substrate surface and the active area, as well as a first surface well region of the second conductivity type (e.g., n-type) disposed on the semiconductor substrate. The first surface well region circumscribes (i.e., encircles) both the deep well region and the active area of the semiconductor substrate, thereby forming a narrow channel region of the first conductivity type (e.g., p-type) in the semiconductor substrate. This narrow channel region separates the deep well region from the first surface well region.

The vertically integrated pinch resistor also includes a first contact region in the first surface well region, a second contact region in the active area, and a third contact region in the semiconductor substrate. The first and second contact regions are capable of being electrically connected to the input node of the MOS logic circuit, while the third contact region is capable of being electrically connected to ground. This structural configuration provides for the input node of the MOS logic circuit to be electrically connected to ground via a low impedance resistive path through the vertically integrated pinch resistor. This structural configuration, therefore, prevents the input node from acquiring a floating gate condition and forces a well defined logic state of "0" on the input node.

In the circumstance where the MOS logic circuit includes driving circuitry, the first contact region and second contact region are also capable of being electrically connected to an output node of the driving circuitry. This structural configuration provides for the input node of the MOS logic circuit to be electrically connected to ground (via a low impedance resistive path through the vertically integrated pinch resistor) when a logic state of "0" or an undefined logic state is applied to the first and second contact regions from the output node of the driving circuitry. Such a connection to ground prevents the input node from acquiring a floating gate condition and forces a well defined logic state of "0" on the input node. However, when a logic state of "1" (i.e., a "high" state, typically a voltage equal to $V_{DD}$) is applied to the first and second contact regions from the output node of the driving circuitry, the low impedance resistive path is pinched-off due to formation of a depletion region in the narrow channel region of the vertically integrated pinch resistor, thereby isolating the input node of the MOS logic circuit and the output node of the driving circuitry from ground and halting the continuous consumption of current.

Also provided is a process for forming a semiconductor device according to the present invention that includes first providing a semiconductor substrate of a first conductivity type (typically p-type), followed by forming a deep well region of a second conductivity type embedded below the surface of the semiconductor substrate. An electrical isolation region is then formed on the semiconductor substrate. A first surface well region of the second conductivity type is subsequently formed immediately underneath the surface of the semiconductor substrate. The first surface well region completely circumscribes (i.e. encircles) the deep well region, producing a narrow channel of the first conductivity type therebetween. Next, a first contact region is formed on the first surface well region. Then a second contact region is formed on the semiconductor substrate above the deep well region, while a third contact region is formed on the semiconductor substrate outside of a perimeter formed by the first surface well region. The deep well region, the first surface well region, the first contact region and the second contact region are formed, for example, by photomasking and ion implantation techniques. A first electrical connection is subsequently formed between the first contact region and an input node of the MOS logic circuit, as well as between the second contact region and the input node of the MOS logic circuit, while a second electrical connection is formed between the third contact region and ground.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which:

FIG. 6 illustrates the condition of the vertically integrated pinch resistor of the present invention when a "low" or undefined state is applied to the first and second contact regions.

FIG. 7, therefore, illustrates the condition of the vertically integrated pinch resistor of the present invention when a "high" state is applied to the first and second contact regions.

DETAILED DESCRIPTION OF THE INVENTION

Figure 1:
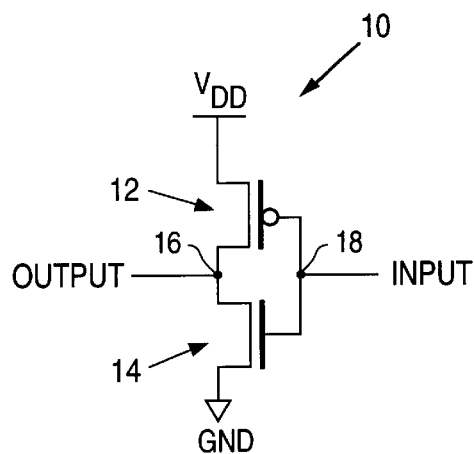
FIG. 1 is an electrical schematic depicting a conventional MOS inverter that includes a floating gate.
Figure 2:
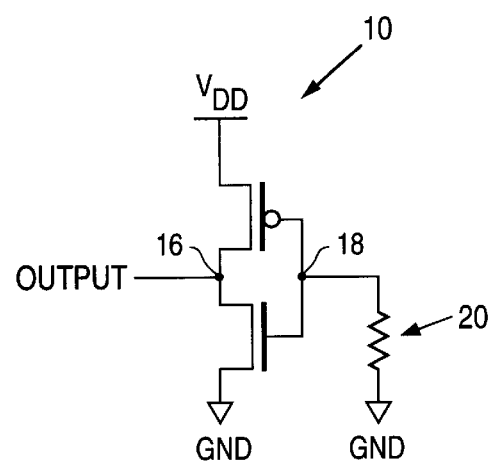
FIG. 2 is an electrical schematic depicting a conventional MOS inverter with the floating gate connected to ground via a resistor.
Figure 3:
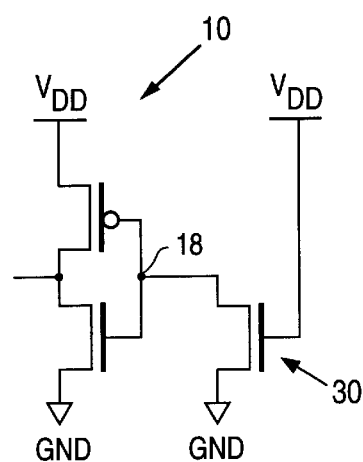
FIG. 3 is an electrical schematic depicting a conventional MOS inverter with the floating gate connected to the source of an MOS transistor.
Figure 4:
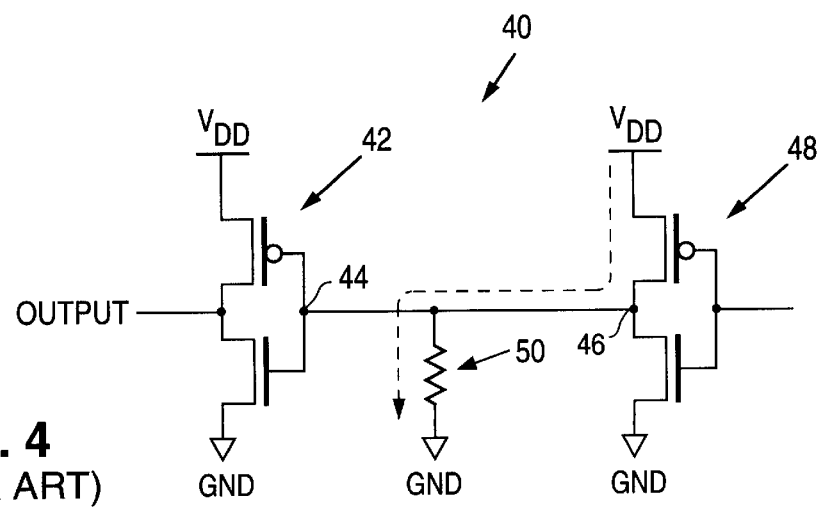
FIG. 4 is an electrical schematic depicting a conventional MOS inverter with its input node connected both to ground (via a resistor) and to the output node of driving circuitry. The dashed arrow depicts the direction of current flow when the output node of the driving circuitry is at a "high" state.
Figure 5:
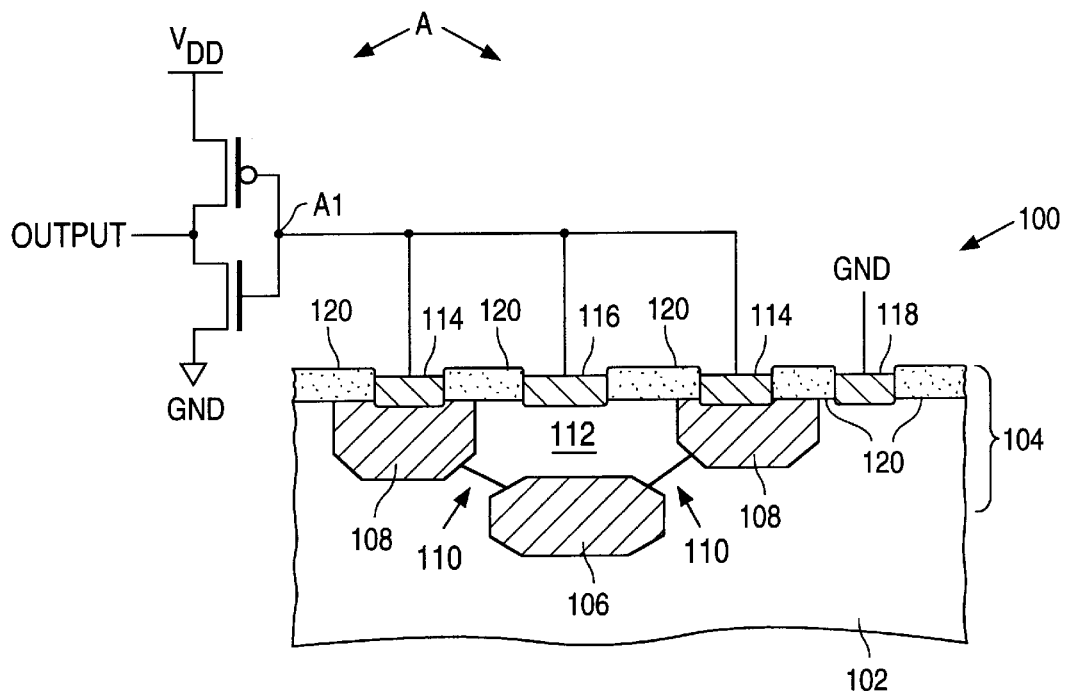
FIG. 5 is a combined cross-sectional and electrical schematic view of a semiconductor device in accordance with the present invention electrically connected to an MOS logic circuit and GND.

FIG. 5 depicts, in combined cross-sectional and electrical schematic format, a semiconductor device 100 according to the present invention for use in preventing a "floating gate" condition in an MOS logic circuit A (in the embodiment of FIG. 5, MOS logic circuit A is illustrated as an MOS inverter). Semiconductor device 100 includes a semiconductor substrate 102 of a first conductivity type (typically P-type) and a vertically integrated pinch resistor 104.

The vertically integrated pinch resistor 104 includes a deep well region 106 of a second conductivity type (typically n-type) disposed below the surface of semiconductor substrate 102, and a first surface well region 108 of the second conductivity type that completely circumscribes (i.e. encircles) the deep well region 106. The peak carrier concentration in the deep well region is typically in the range of 1E+15 to 1E+16 ions per $cm^3$. The first surface well region 108 can partially overlap, or be offset (e.g. 0.5 microns to 7.0 microns) from, the deep well region 106.

The distance between the bottom of the first surface well region 108 and the associated surface of the semiconductor substrate 102, namely the depth of the first surface well region 108, is typically in the range of 0.7 microns (for a 0.1 micron process technology) to about 4.0 microns (for a 5 micron process technology). The distance from the top of the deep well region 106 to the associated surface of the semiconductor substrate 102 is predetermined based on the depth of the first surface well region 108. In one embodiment, the top of the deep well region 106 is approximately level with, or slightly underneath, the bottom of the associated first surface well region 108. A typical width for the deep well region is 1 micron, while that of the first surface well region is 0.4 microns.

The deep well region 106 is separated from the first surface well region 108 within the vertically integrated pinch resistor 104 by a narrow channel region 110, which is of the first conductivity type. At its narrowest point, the narrow channel region 110 is typically from 0.2 microns to greater than 5.0 microns in width, depending on the power supply voltage that will be employed to drive an associated MOS logic circuit. For a five (5) volt device technology, the narrow channel region 110 will typically be up to five (5) microns in width, while for a 3.3 volt technology, up to two (2) microns.

The vertically integrated pinch resistor 104 optionally includes a second surface well region 112 of the first conductivity type in the semiconductor substrate 102 above the associated deep well region 106. Since the second surface well region 112 is of the same conductivity type as the semiconductor substrate 102, the second surface well region 112 need not be present in semiconductor devices according to the present invention. If the second surface well region 112 is not present, the region of the semiconductor substrate 102 above the deep well region is simply referred to as an active area. It is, however, standard practice to form such a second surface well region in conventional MOS device processing. The inclusion of a second surface well region 112 in the vertically integrated pinch resistor 104, therefore, provides for a semiconductor device that can be manufactured with a minimum number of deviations from standard semiconductor processing techniques.

Referring again to FIG. 5, the vertically integrated pinch resistor 104 also includes first contact region 114 disposed on the first surface well region 108, a second contact region 116 disposed on the semiconductor substrate 102 above the deep well region 106, and a third contact region 118 disposed on the semiconductor substrate 102 beyond the outer perimeter of the first surface well region 108. The first contact region 114 is of the same conductivity type as the first surface well region 108, while the second contact region 116 and the third contact region 118 are of the same conductivity type as the semiconductor substrate 102. Typically, the first contact region 114, the second contact region 116 and the third contact region 118 are formed by increasing the doping level of a portion of the first surface well region 108, a portion of the second surface well region 112 and a portion of the semiconductor substrate 102, respectively. For example, in the circumstance where the semiconductor substrate and second surface well region (or active area) are p-type, and the deep well region and first surface well region are, therefore, n-type, the first contact region is simply a more heavily doped n-type region (i.e. an $n^+$ region) within the first surface well region. Similarly, the second contact region and the third contact region are merely more heavily doped p-type regions (i.e. $p^+$ regions) within the second surface well region (or active area) and semiconductor substrate, respectively.

First contact region 114 serves as an electrical connection node for electrically connecting the vertically integrated pinch resistor 104 to the input node of an MOS logic circuit, as shown in the electrical schematic portion of FIG. 5. The second contact region 116 also serves to electrically connect the vertically integrated pinch resistor 104 to the same input node of an MOS logic circuit, as shown in the electrical schematic portion of FIG. 5. The third contact region serves as an electrical connection between the vertically integrated pinch resistor 104 and ground (e.g., $V_{SS}$), as illustrated in FIG. 5. The depth of the first contact region 114, the second contact region 116 and the third contact region 118, which is process technology dependent, is typically 0.05 micron to 1 micron. The width of these contact regions is typically greater than 0.2 micron.

Vertically integrated pinch resistor 104 also includes electrical isolation regions 120, typically formed of silicon oxide ($SiO_2$), that separate and electrically isolate the first contact region 114, the second contact region 116 and the third contact region 118 from each other. Electrical isolation regions 120 also isolate a vertically integrated pinch resistor 104 from nearby integrated circuit semiconductor devices (not shown).

As illustrated in FIG. 5, semiconductor device 100 provides an electrical connection from the input node A1 of MOS logic circuit A to GND via the vertically integrated pinch resistor 104. The electrical connection includes a low impedance resistive path between the second contact region 116 and GND that passes through the second surface well region 112, the narrow channel region 110 and the third contact region 118. The presence of this electrical connection imposes a well defined logic state of "0" on the input node A1 of the MOS logic circuit A.

Figure 6:
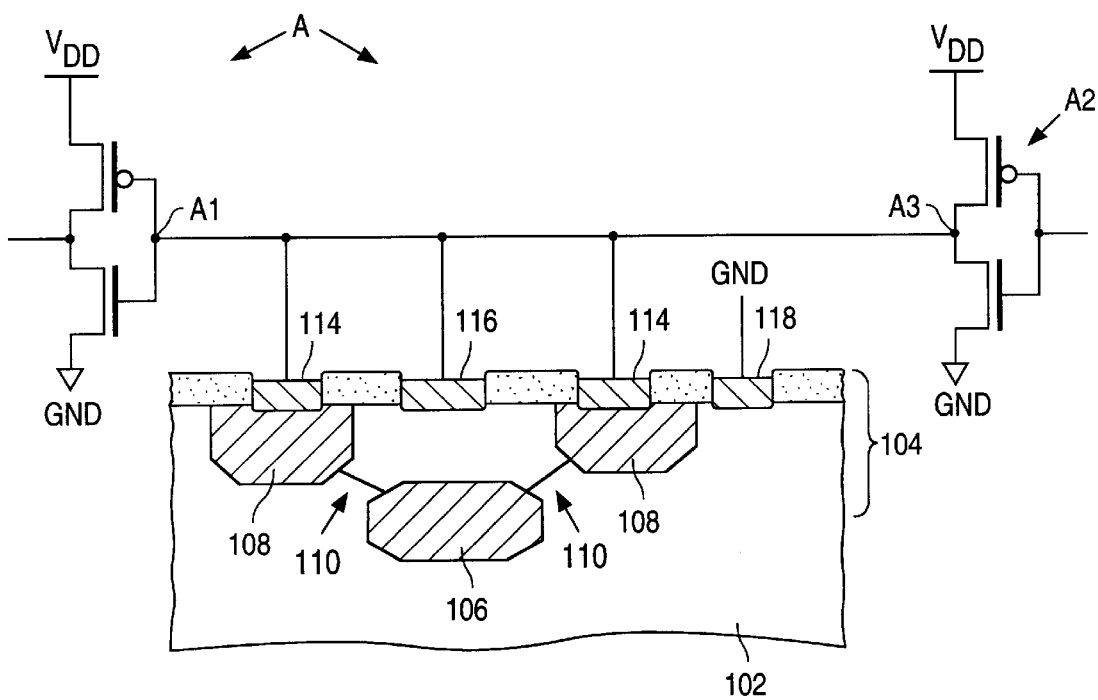
FIG. 6 is a combined cross-sectional and electrical schematic view of a semiconductor device in accordance with the present invention electrically connected to an MOS logic circuit that includes driving circuitry, as well as electrically connected to GND.
Figure 7:
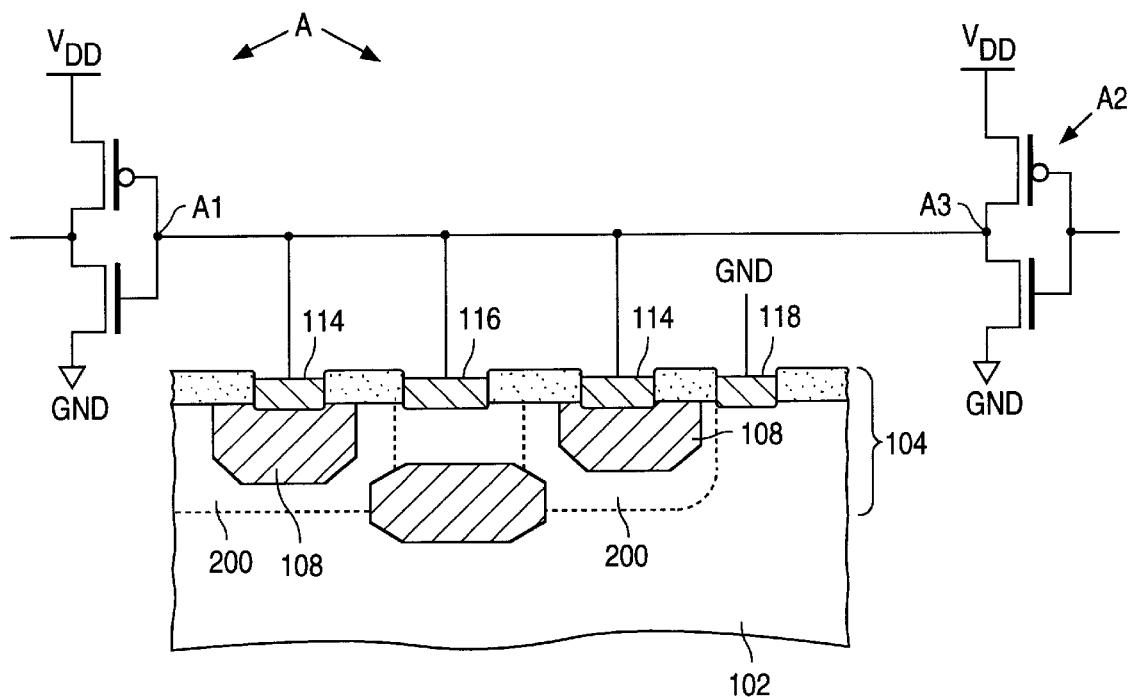
FIG. 7 is a combined cross-sectional and electrical schematic view of a semiconductor device in accordance with the present invention, with perforated lines depicting the presence of depletion regions "pinching off" a current path through the vertically integrated pinch resistor.

FIGS. 6 and 7 illustrate the semiconductor device of FIG. 5 further connected to driving circuitry A2 (represented as an MOS inverter) that is additionally included within MOS logic circuit A. Driving circuitry A2 includes an output node A3 adapted to provide an input signal to input node A1. When the input signal is "low," the input node A1 of the MOS logic circuit is electrically connected to GND via the low impedance resistive path described with respect to FIG. 5. However, when the input signal is "high," the input node A1 of the MOS logic circuit is electrically isolated from GND by the pinched-off narrow channel region of the vertically integrated pinch resistor 104 (see FIG. 7, which depicts a pinched-off narrow channel region). The resistance of the vertically integrated pinch resistor 104 is typically 1 MEG-ohms or more when the narrow channel region is pinched-off.

The manner in which the low impedance resistive path is provided and the manner in which narrow channel region is pinched-off will be readily understood by one of skill in the art from the following description. In the vertically integrated pinch resistor 104, the narrow channel region 110 (typically p-type) is disposed between the first surface well region 108 and the deep well region 106 (both of which are typically n-type) within the vertically integrated pinch resistor 104. When no potential or a low potential is applied to the first contact region 114 (i.e. a logic state of "0" or an undefined logic state), the resistance of the vertically integrated pinch resistor 104 is typically in the range of 10 ohms to a few kilo-ohms, due to the current path provided by the presence of the narrow channel region 110. Therefore, a semiconductor device according to the present invention provides a near "short circuit" between the input node of the MOS logic circuit and ground when a logic state of "0" or an undefined logic state is applied to the first contact region 114. However, upon application of a potential (e.g., a high logic state from the output node A3 of driving circuitry A2) sufficient to produce a depletion region 200 extending from the first surface well regions 108 toward the deep well regions 106 (as indicated by perforated lines in FIG. 7), the resistance of the vertically integrated pinch resistor 104 can be increased to more than 1 MEG-ohms, or even to an essentially "open circuit." When a high logic state is applied to the first contact region 114 (for example, from the output node A3 of the MOS logic circuit driving circuitry A2), this depletion region 200 "pinches off" the width of the narrow channel regions 110 by creating potential barriers within the current path of the vertically integrated pinch resistor 104. If the depletion region 200 extends across the narrow channel region 110 until it meets the deep well region 106, the current path of the vertically integrated pinch resistor 104 is completely blocked. This complete blockage of the current path creates an essentially "open circuit," thereby assuring adequate electrical isolation between the input node A1 of the MOS logic circuit A and GND. It also provides electrical isolation between the output node A3 of the driving circuitry A2 and GND, thereby preventing current consumption.

The electrical characteristics and behavior of vertically integrated pinch resistors is described further in U.S. appplication Ser. No. 09/196,458 and U.S. application Ser. No. 09/205,110, both of which are hereby fully incorporated by reference.

Semiconductor devices according to the present invention can be used to prevent a floating gate condition on the input node of any type of MOS logic circuit, including NOT, NAND and NOR logic circuits. Semiconductor devices according to the present invention can also be used, for example, to prevent a floating gate condition on an input node of an MOS logic circuit that constitutes a controller for an integrated circuit (IC) that includes embedded memory (e.g., ROM, SRAM and Dual-port SRAM memory).

Figure 8:
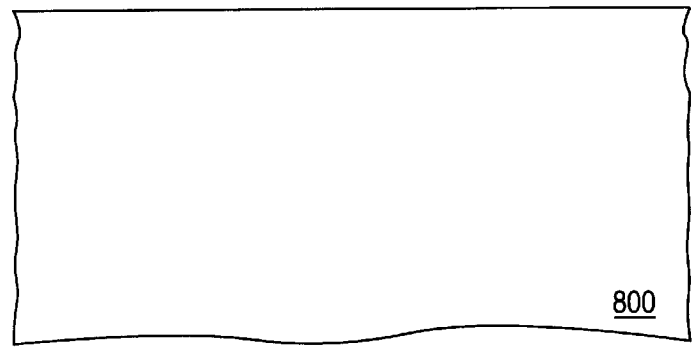
FIGS. 8–13 are cross-sectional views illustrating stages of a process according to the present invention.
Figure 9:
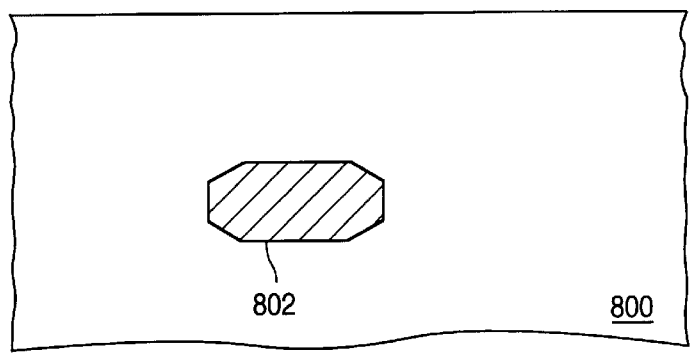

Also provided is a process for forming a semiconductor device according to the present invention that is simple and compatible with standard MOS manufacturing techniques. FIGS. 8–13 illustrate, using cross-sectional views, stages of a process for the formation of a semiconductor device according to the present invention. A semiconductor substrate 800 of a first conductivity type (typically p-type) is initially provided, as shown in FIG. 8. A deep well region 802 of a second conductivity type (typically n-type) is then formed in semiconductor substrate 800, as illustrated in FIG. 9. Deep well region 802 can be formed using conventional photomasking, dopant ion implantation and thermal diffusion techniques known to those of skill in the art. Typical deep well formation steps can include first forming a patterned deep well photomask on the semiconductor substrate 800, followed by ion implantation, removal of the photomask, and thermal diffusion and activation of the implanted ions.

Typical conditions used for the formation of an n-type deep well region are a phosphorus ion implant through a patterned photomask with the phosphorous ($P_{31}^+$) ion dose being in the range of 1E+12 to 1E+14 ions/cm² and the implant energy being in the range of 100 KeV to 1000 KeV. After removal of the patterned photomask, the implanted phosphorus ions are thermally diffused into the semiconductor substrate 802 at a temperature of 1000° C. to 1175° C. for several hours in a 5%–10% oxygen ($O_2$) ambient. The resultant structure, following removal of any silicon oxide ($SiO_2$) layer grown on the semiconductor substrate during the thermal diffusion process, is illustrated in FIG. 9. When forming an n-type deep well region, any n-type dopant can be used, including, for example, phosphorus, arsenic or antimony. If arsenic or antimony are employed, thermal diffusion at a higher temperature may be required since these dopants diffuse at a slower rate than phosphorus at any given temperature. In addition, since phosphorus is lighter than arsenic or antimony, phosphorus ion can be more easily implanted to the required depth. The 5–15% $O_2$ ambient is used to accelerate the diffusion.

Figure 10:
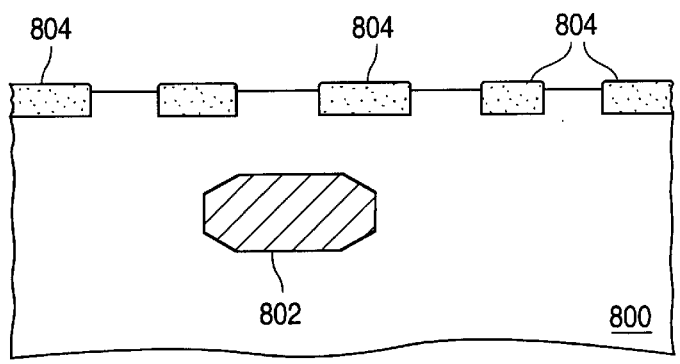

Next, electrical isolation regions 804 are formed, as illustrated in FIG. 10, using conventional processes such as Shallow Trench Isolation (STI) or LOCal Oxidation of Silicon (LOCOS) that are well known in the art. The dimensions of the electrical isolation regions are dependent on the process technology used to form the MOS logic circuit, with which the present semiconductor device will be used. The thickness of a typical electrical isolation region formed by LOCOS is, however, in the range of 2000 angstroms to 5000 angstroms, while that formed by STI is in the range of 2000 angstroms to 4000 angstroms.

Figure 11:
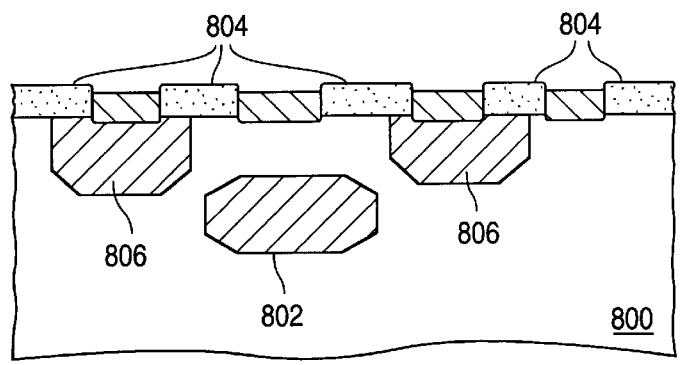
Figure 12:
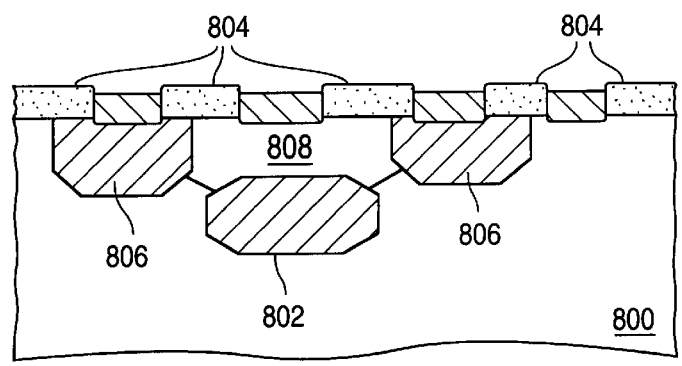

Next, first surface well region 806 of the second conductivity type is formed on the semiconductor substrate 800 such that the first surface well region 806 circumscribes (i.e. encircles) the deep well region 802. The resulting structure is illustrated in FIG. 11. The distance between the inner contour of the first surface well region and the outer boundary of the deep well region (i.e. the narrow channel region width) determines the "pinch-off" voltage necessary to isolate the input node of an MOS logic circuit from ground using the semiconductor device according to the present invention.

First surface well region 806 can be formed using conventional photomasking and dopant ion implantation techniques known to those of skill in the art. Typical first surface well formation steps can include first forming a patterned first surface well photomask on the semiconductor substrate 800, followed by ion implantation and removal of the photomask. Typical conditions for the formation of an n-type first surface well region are a phosphorus ion implant through a patterned photomask, with the phosphorous ($P_{31}^+$) ion dose being in the range of 1E+11 to 1E12 ions/cm² and the implant energy being in the range of 100 KeV to 200 KeV. Thermal diffusion steps are infrequently used with surface well region ion implantation techniques, but when employed, the typical temperature of such a thermal diffusion is in the range of 900° C. to 1150° C.

Next, second surface well region 808 of the first conductivity type is optionally formed in the semiconductor substrate above the deep well region 802, using standard photomasking and dopant ion implantation techniques. For a p-type second surface well region formation, a boron ($B_{11}^+$) ion dose in the range of 1E+11 to 1E+13 ions per cm² at an energy of 60 KeV to 150 KeV energy would be typical. The resulting structure is depicted in cross-section in FIG. 12. Although a second surface well region is not required with respect to operation of the semiconductor device according to the present invention, it would be preferable to have as highly a doped second surface well region as possible (along with a highly doped semiconductor substrate), in order to reduce the impedance of the vertically integrated pinch resistor.

Figure 13:
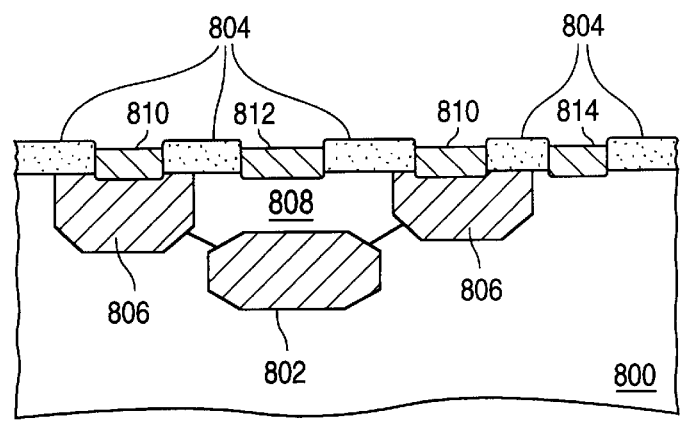

Next, first contact region 810 is formed on the first surface well region 806 using, for example, standard photomasking and ion implantation techniques. A typical dose for a heavily phosphorus ion doped n-type first contact region is in the range of 1E+15 to 1E+16 ions per cm². Second contact region 812 is then formed on the second surface well region 808 (or active area), while third contact region 814 is formed on a portion of the semiconductor substrate 800, both using, for example, standard photomasking and ion implantation techniques. A typical dose for heavily boron ion doped p-type second and third contact regions is in the range of 1E+15 to 1E+16 ions per cm². The first contact region 810, the second contact region 812 and the third contact region 814 are formed in such a manner that they are separated by electrical isolation regions 804. The resultant cross sectional structure is illustrated in FIG. 13. Processes for the formation of vertically integrated pinch resistors are further described in U.S. application Ser. No. 09/196,458 and U.S. application Ser. No. 09/205,110, both of which are hereby fully incorporated by reference.

Figure 14:
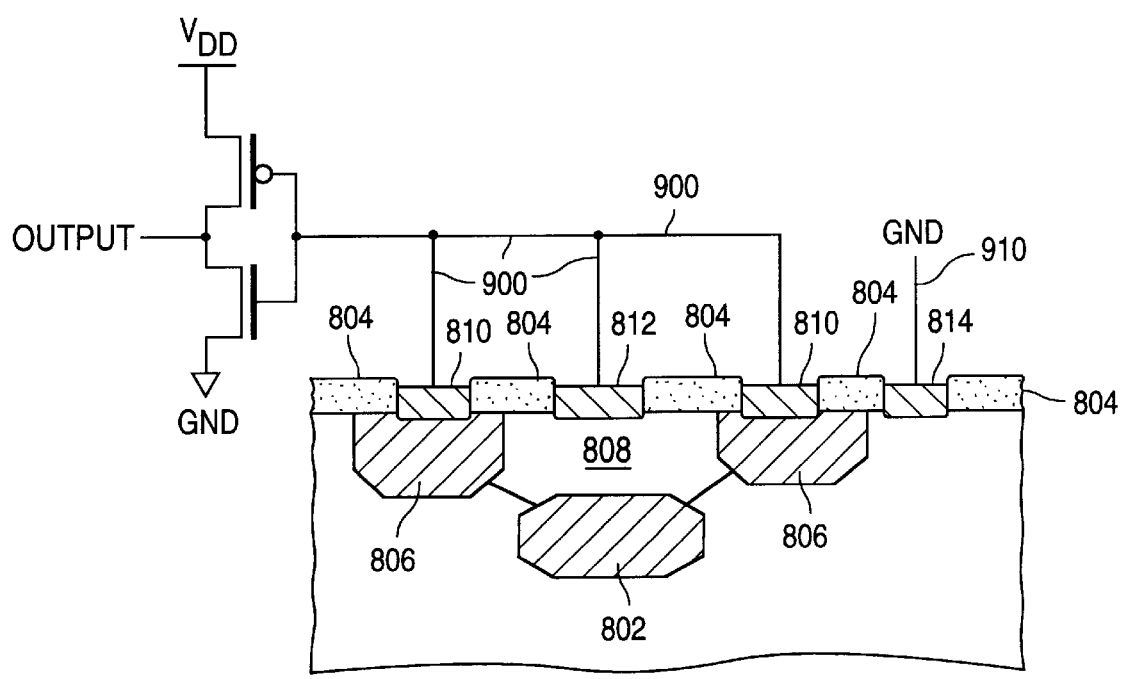
FIG. 14 is a combined cross-sectional and electrical schematic view of a stage in a process in accordance with the present invention.

In semiconductor devices according to the present invention, first contact region 810 and second contact region 812 are capable of being electrically connected to the input node of an MOS logic circuit. In addition, the third contact region 814 is capable of being connected to ground. It is, therefore, expected that a first electrical connection 900 will be formed between the first contact region 810 and the input node of an MOS logic circuit, as well as between the second contact region 812 and the input node of an MOS logic circuit, while a second electrical connection 910 will be formed between the third contact region 814 and GND, as illustrated in FIG. 14. The formation of these electrical connections can be accomplished, for example, by depositing a dielectric layer, followed by etching contacts through the dielectric layer using standard photomasking and etching techniques, and subsequently forming metal lines using metal layer deposition and patterning techniques known in the art. The semiconductor device according to the present invention illustrated in FIG. 14 is functionally equivalent to that of FIG. 5. Furthermore, when driving circuitry is present in the MOS logic circuit, the first and second contact regions can be further electrically connected to an output node of the driving circuitry via a third electrical connection.

It should be understood that various alternatives to the embodiments of the invention described herein may be employed in practicing the invention. For example, it should be understood the MOS logic circuits encompass NMOS, PMOS and CMOS logic circuits. It is intended that the following claims define the scope of the invention and that structures and methods within the scope of these claims and their equivalents be covered thereby.

What is claimed is:

1. A semiconductor device for the prevention of a floating gate condition on an input node of a MOS logic circuit, the semiconductor device comprising:
   a semiconductor substrate of a first conductivity type having an active area on its surface; and
   a vertically integrated pinch resistor formed in the semiconductor substrate including:
      a deep well region of a second conductivity type disposed below the active area of the semiconductor substrate;
      a first surface well region of the second conductivity type disposed on the semiconductor substrate, the first surface well region circumscribing the deep well region and the active area of the semiconductor substrate;
      a narrow channel region of the first conductivity type disposed in the semiconductor substrate, the narrow channel region separating the deep well region from the first surface well region;
      a first contact region disposed in the first surface well region and capable of electrically connecting the first surface well region to an input node of the MOS logic circuit;
      a second contact region disposed in the active area and capable of electrically connecting the active area to the input node of the MOS logic circuit; and
      a third contact region disposed in the semiconductor substrate and capable of electrically connecting the semiconductor substrate to ground;
   whereby, the input node of the MOS logic circuit can be electrically connected to ground and therefore prevented from acquiring a floating gate condition.

2. The semiconductor device of claim 1 wherein:
   the MOS logic circuit includes driving circuitry; and
   the first contact region, second contact region, and input node of the MOS logic circuit are also capable of being electrically connected to an output node of the driving circuitry; and
   whereby when a logic state of "0" or an undefined logic state is applied to the first and second contact regions from the output node of the driving circuitry, the vertically integrated pinch resistor provides a low impedance resistive path from the input node of the MOS logic circuit to ground, thus forcing a well defined logic state of "0" on the input node, and
   whereby when a logic state of "1" is applied to the first and second contact regions from the output node of the driving circuitry, the low impedance resistive path is pinched-off due to formation of a depletion region in the narrow channel region, thereby isolating the input node of the CMOS logic circuit and the output node of the driving circuitry from ground.

3. The semiconductor device of claim 1 further including at least one electrical isolation region separating and electrically isolating the first contact region from the second contact region.

4. The semiconductor device of claim 1 wherein the first surface well region partially overlaps the deep well region.

5. The semiconductor device of claim 1 wherein the active area includes a second surface well region of the first conductivity type.

6. The semiconductor device of claim 1 wherein the narrow channel region separates the deep well region from the first surface well region by a distance of 0.2 microns to 5.0 microns.

7. The semiconductor device of claim 1 wherein the first conductivity type is p-type and the second conductivity type is n-type.

8. The semiconductor device of claim 1 wherein the first contact region and second contact region are connected to the input node of an MOS logic circuit inverter.

9. The semiconductor device of claim 2 wherein the first contact region and second contact region are connected to an input node of an MOS logic circuit selected from the MOS logic circuit group consisting of NOT MOS logic circuits, NAND MOS logic circuits, NOR MOS logic circuits and MOS logic circuits combined with embedded memory circuits.

10. A method for the formation of a semiconductor device for the prevention of a floating gate condition on an input node of a MOS logic circuit, the method comprising the steps of:
   providing a semiconductor substrate of a first conductivity type;
   forming a deep well region of a second conductivity type embedded below the surface of the semiconductor substrate;
   forming at least one electrical isolation region on the semiconductor substrate;
   forming a first surface well region of the second conductivity type on the semiconductor substrate that circumscribes the deep well region;
   forming a first contact region of the second conductivity type on the first surface well region;
   forming a second contact region of the first conductivity type on the semiconductor substrate above the deep well region;
   forming a third contact region of the first conductivity type on the semiconductor substrate outside of a perimeter formed by the first surface well region; and
   forming a first electrical connection between the first and second contact regions and an input node of the MOS logic circuit and a second electrical connection between the third contact region and ground;
   wherein each of the first contact region, second contact region and third contact region is separated from one another by the electrical isolation region.

11. The method of claim 10 further includes, after the last step, a step of forming a third electrical connection between the first and second contact regions and an output node of driving circuitry of the MOS logic circuit.

12. The method of claim 10, wherein the providing step includes providing a semiconductor substrate of p-type conductivity.

13. The method of claim 10 further including a step of forming a second surface well region of the first conductivity type on the semiconductor substrate above the deep well region, after the step of forming the first surface well region and before the step of forming the first contact region.

14. The method of claim 10, wherein the steps of forming the deep well region, the first surface well region and the second surface well region are performed using photomasking and ion implantation processes.

15. The method of claim 10, wherein the step of forming the first surface well region includes forming a first surface well region that partially overlaps the deep well region.

* * * * *